United States Patent
Tai et al.

(10) Patent No.: US 10,141,953 B2
(45) Date of Patent: Nov. 27, 2018

(54) LOW-DENSITY PARITY-CHECK APPARATUS AND MATRIX TRAPPING SET BREAKING METHOD

(71) Applicant: VIA Technologies, Inc., New Taipei (TW)

(72) Inventors: Ying Yu Tai, Mountain View, CA (US); Jiangli Zhu, San Jose, CA (US)

(73) Assignee: VIA Technologies, Inc., New Taipei (TW)

( * ) Notice: Subject to any disclaimer, the term of this patent is extended or adjusted under 35 U.S.C. 154(b) by 83 days.

(21) Appl. No.: 15/379,450

(22) Filed: Dec. 14, 2016

(65) Prior Publication Data

US 2018/0167086 A1   Jun. 14, 2018

(51) Int. Cl.
| | |
|---|---|
| H03M 13/00 | (2006.01) |
| H03M 13/11 | (2006.01) |
| H03M 13/17 | (2006.01) |
| H03M 13/25 | (2006.01) |
| H03M 13/37 | (2006.01) |

(52) U.S. Cl.
CPC ..... *H03M 13/255* (2013.01); *H03M 13/1142* (2013.01); *H03M 13/175* (2013.01); *H03M 13/3746* (2013.01); *H03M 13/3753* (2013.01); *H03M 13/616* (2013.01); *H03M 13/1117* (2013.01)

(58) Field of Classification Search
CPC ............. H03M 13/255; H03M 13/616; H03M 13/3746; H03M 13/1111; H03M 13/1128; H03M 13/1142; H03M 13/1117; H03M 13/175; H03M 13/3753

USPC .......................................................... 714/752
See application file for complete search history.

(56) References Cited

U.S. PATENT DOCUMENTS

| | | | |
|---|---|---|---|
| 8,359,522 B2 * | 1/2013 | Gunnann | H03M 13/1177 714/758 |
| 8,689,084 B1 * | 4/2014 | Tai | H03M 13/112 714/24 |
| 8,739,004 B2 * | 5/2014 | Olcay | H03M 13/1108 714/752 |

(Continued)

OTHER PUBLICATIONS

"Office Action of Taiwan Counterpart Application," dated May 11, 2018, p. 1-p. 6.

*Primary Examiner* — James C Kerveros
(74) *Attorney, Agent, or Firm* — JCIPRNET

(57) ABSTRACT

A low-density parity-check (LDPC) apparatus and a matrix trapping set breaking method are provided. The LDPC apparatus includes a logarithm likelihood ratio (LLR) mapping circuit, a variable node (VN) calculation circuit, an adjustment circuit, a check nodes (CN) calculation circuit and a controller. The LLR mapping circuit converts an original codeword into a LLR vector. The VN calculation circuit calculates original V2C information by using the LLR vector and C2V information. The adjustment circuit adjusts the original V2C information to get adjusted V2C information in accordance with a factor. The CN calculation circuit calculates the C2V information by using the adjusted V2C information, and provides the C2V information to the VN calculation circuit. The controller determines whether to adjust the factor. When LDPC iteration operation falls into matrix trap set, the controller decides to adjust the factor so that the iteration operation breaks away from the matrix trap set.

17 Claims, 4 Drawing Sheets

(56) References Cited

U.S. PATENT DOCUMENTS

| | | |
|---|---|---|
| 8,930,788 B2 * | 1/2015 | Zhang ................ H03M 13/658 |
| | | 714/752 |
| 8,935,598 B1 | 1/2015 | Norrie |
| 8,984,365 B1 | 3/2015 | Norrie |
| 8,984,376 B1 * | 3/2015 | Norrie ................ H03M 13/1142 |
| | | 714/772 |
| 8,990,661 B1 | 3/2015 | Micheloni et al. |
| 2007/0220398 A1 | 9/2007 | Moon et al. |
| 2011/0083058 A1 | 4/2011 | Hu et al. |
| 2013/0254628 A1 | 9/2013 | Kim et al. |
| 2014/0068368 A1 * | 3/2014 | Zhang ................ H03M 13/658 |
| | | 714/752 |
| 2016/0191079 A1 | 6/2016 | Zuo et al. |

\* cited by examiner

LOW-DENSITY PARITY-CHECK APPARATUS AND MATRIX TRAPPING SET BREAKING METHOD

BACKGROUND OF THE INVENTION

Field of the Invention

The invention relates to a parity-check technique, and particularly relates to a low-density parity-check (LDPC) apparatus and a matrix trapping set breaking method.

Description of Related Art

Compared with a conventional hard disk device, a solid state driver (SSD) equipped with a flash memory has a fast read/write performance and low power consumption. The SSD is a commonly used data storage device. A SSD system (firmware or hardware) may perform a low-density parity-check (LDPC) encoding to original data to obtain an original codeword, and then write the codeword into the flash memory of the SSD. The SSD system (firmware or hardware) may further read the original codeword from the SSD, and then perform LDPC decoding to the original codeword to obtain original data.

A check matrix H for LDPC defines a relationship between a plurality of variable nodes (VNs) and a plurality of check nodes (CNs). The check matrix H may be determined according to an actual design requirement. An iteration operation of the LDPC decoding includes calculating V2C information transmitted from the VN to the CN according to C2V information, and calculating the C2V information transmitted from the CN to the VN according to the V2C information. Calculation detail of the V2C information and calculation detail of the C2V information belong to conventional technique, and detail thereof is not repeated.

Generally, the smaller the noise is, the smaller a bit error rate (BER) of the original codeword is, and the lower a frame error rate (FER) of the LDPC decoding is. In any case, the iteration operation of the LDPC decoding probably has a matrix trapping set phenomenon. When the matrix trapping set phenomenon is occurred, even if the BER is decreased, the FER of the LDPC decoding is not obviously decreased. Alternatively, even if the BER is decreased, a decreasing speed of the FER of the LDPC decoding is far less than a normal decreasing speed. Therefore, when the iteration operation falls into the matrix trapping set, the SSD requires to execute a matrix trapping set breaking operation, such that the iteration operation of the LDPC decoding is not kept trapping in an iteration loop of the matrix trapping set.

SUMMARY OF THE INVENTION

The invention is directed to a low-density parity-check (LDPC) apparatus and a matrix trapping set breaking method, by which an iteration operation executed by the LDPC apparatus breaks from a matrix trapping set.

An embodiment of the invention provides a low-density parity-check (LDPC) apparatus adapted to perform an iteration operation to decode an original codeword. The LDPC apparatus includes a log likelihood ratio (LLR) mapping circuit, a variable node (VN) calculation circuit, an adjustment circuit, a check node (CN) calculation circuit and a controller. The LLR mapping circuit is configured to convert the original codeword into a LLR vector according to a mapping relationship. The VN calculation circuit is coupled to the LLR mapping circuit, and receives the LLR vector. The VN calculation circuit is configured to calculate at least one original V2C information from at least one VN to at least one CN by using the LLR vector and at least one C2V information. The adjustment circuit is coupled to the VN calculation circuit to receive the original V2C information. The adjustment circuit is configured to adjust the original V2C information to obtain at least one adjusted V2C information according to at least one factor. The CN calculation circuit is coupled to the adjustment circuit to receive the adjusted V2C information. The CN calculation circuit is configured to calculate the at least one C2V information from the CN to the VN by using the adjusted V2C information, and provides the at least one C2V information to the VN calculation circuit. The controller is coupled to the adjustment circuit. The controller is configured to determine whether to adjust the factor. When the iteration operation falls into a matrix trapping set, the controller decides to adjust the factor so that the iteration operation breaks away from the matrix trapping set.

An embodiment of the invention provides a matrix trapping set breaking method adapted to make an iteration operation executed by a LDPC apparatus to break away from a matrix trapping set. The matrix trapping set breaking method includes: converting an original codeword into a LLR vector according to a mapping relationship; calculating at least one original V2C information from at least one variable node (VN) to at least one check node (CN) by using the LLR vector and at least one C2V information; adjusting the original V2C information to obtain at least one adjusted V2C information according to at least one factor; calculating the at least one C2V information from the CN to the VN by using the adjusted V2C information; and determining whether to adjust the factor, where when the iteration operation falls into a matrix trapping set, it is determined to adjust the factor so that the iteration operation breaks away from the matrix trapping set.

According to the above description, the LDPC apparatus and the matrix trapping set breaking method of the invention may determine whether to adjust the V2C information transmitted to the CN from the VN. When the iteration operation of the LDPC decoding falls into the matrix trapping set, it is determined to adjust the factor to change the adjusted V2C information, so that the iteration operation breaks away from the matrix trapping set.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
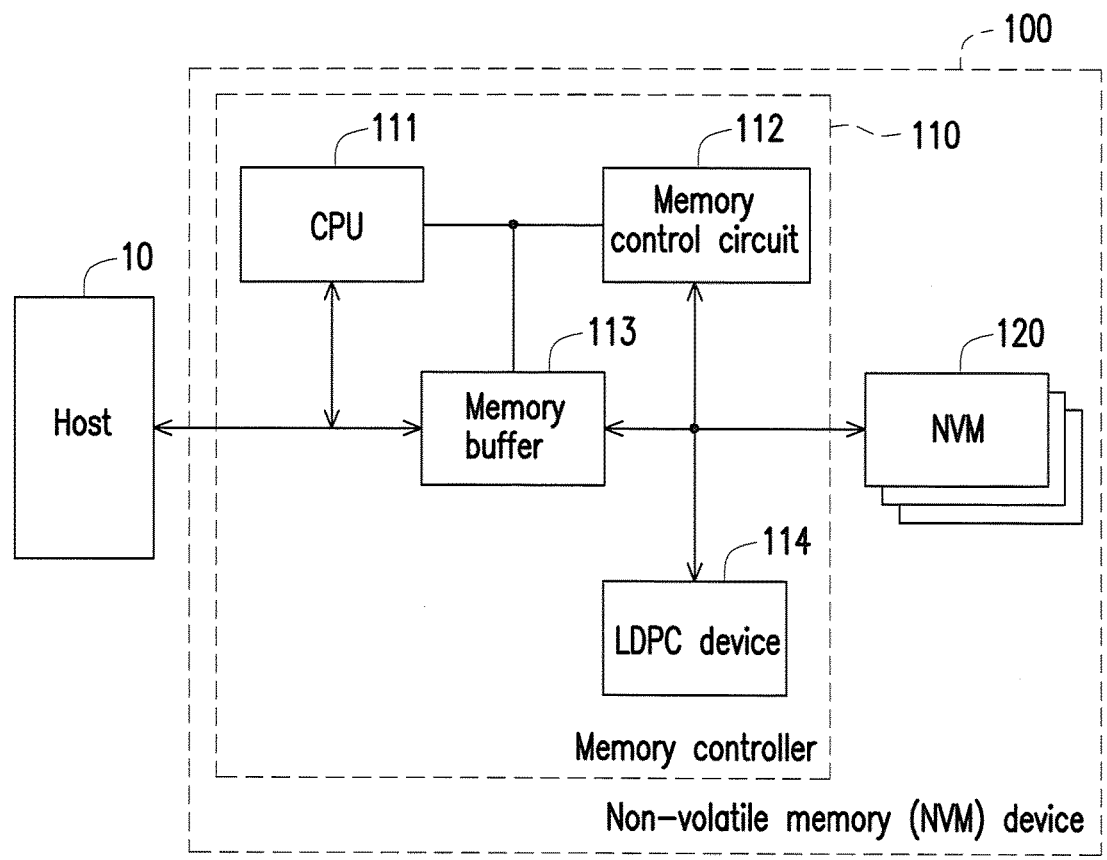
FIG. 1 is a circuit block schematic diagram of a non-volatile memory device according to an embodiment of the invention.

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

FIG. 1 is a circuit block schematic diagram of a non-volatile memory (NVM) device 100 according to an embodiment of the invention. According to a design requirement, the NVM device 100 can be a flash drive, a solid state disc (SSD) or other storage devices. The NVM device 100 can be coupled to a host 10. The host 10 can be a computer, a mobile phone, a multimedia player, a camera or other electronic devices. The NVM device 100 includes a memory controller 110 and a non-volatile memory (NVM) 120. According to a design requirement, the NVM 120 can be a NAND flash memory or other non-volatile storage circuit/device.

The memory controller 110 is coupled to the NVM 120. The memory controller 110 may access the NVM 120 according to a logic address of a write command of the host 10. In some embodiments, the logic address information can be a logical block address (LBA) or other logical address. In the embodiment of FIG. 1, the memory controller 110 includes a central processing unit (CPU) 111, a memory control circuit 112, a memory buffer 113 and a low-density parity-check (LDPC) device 114. The CPU 111 is coupled to the host 10 through a communication interface. According to a design requirement, the communication interface includes a small computer system interface (SCSI), a serial attached SCSI (SAS), an enhanced small disk interface (ESDI), a serial advanced technology attachment (SATA), a peripheral component interconnect express (PCI-express), an integrated drive electronics (IDE) interface, a universal serial bus (USB), a thunderbolt interface or other interface. The interface structure between the host 10 and the NVM device 100 is not limited by the invention.

When the host 10 sends a write command, data to be written can be temporarily stored in the memory buffer 113, and the CPU 111 may convert/decode the write command (including a logical address) of the host 10 into a corresponding internal control signal (including a physical address of the NVM 120), and provide the internal control signal to the memory control circuit 112 and/or the memory buffer 113. The memory buffer 113, for example, includes a dynamic random access memory (DRAM), a static random access memory (SRAM), or other volatile memory. The LDPC device 114 may execute a LDPC algorithm to encode the data temporarily stored in the memory buffer 113 into a codeword. The memory control circuit 112 may address/control the NVM 120 according to the internal control signal, so as to write the codeword into the NVM 120.

When the host 10 sends a read command, the CPU 111 may convert/decode the read command (including a logical address) of the host 10 into a corresponding internal control signal (including a physical address of the NVM 120). The memory control circuit 112 may address/control the NVM 120 according to the internal control signal, so as to read the original codeword from the NVM 120. The LDPC device 114 may execute the LDPC algorithm to decode the original codeword into data, and temporarily store the decoded data into the memory buffer 113. Then, the CPU 111 may transmit the data temporarily stored in the memory buffer 113 to the host 10.

A check matrix H of the LDPC defines a relationship between a plurality of variable nodes (VNs) and a plurality of check nodes (CNs). The number of rows of the check matrix H represents the number of the CNs, and the number of columns of the check matrix H represents the number of the VNs. In a LDPC calculation process, information is transmitted between the VNs and the CNs. Through multiple iteration operations in the LDPC calculation process, the information of the VNs is converged to complete a decoding calculation of the LDPC.

Figure 2:
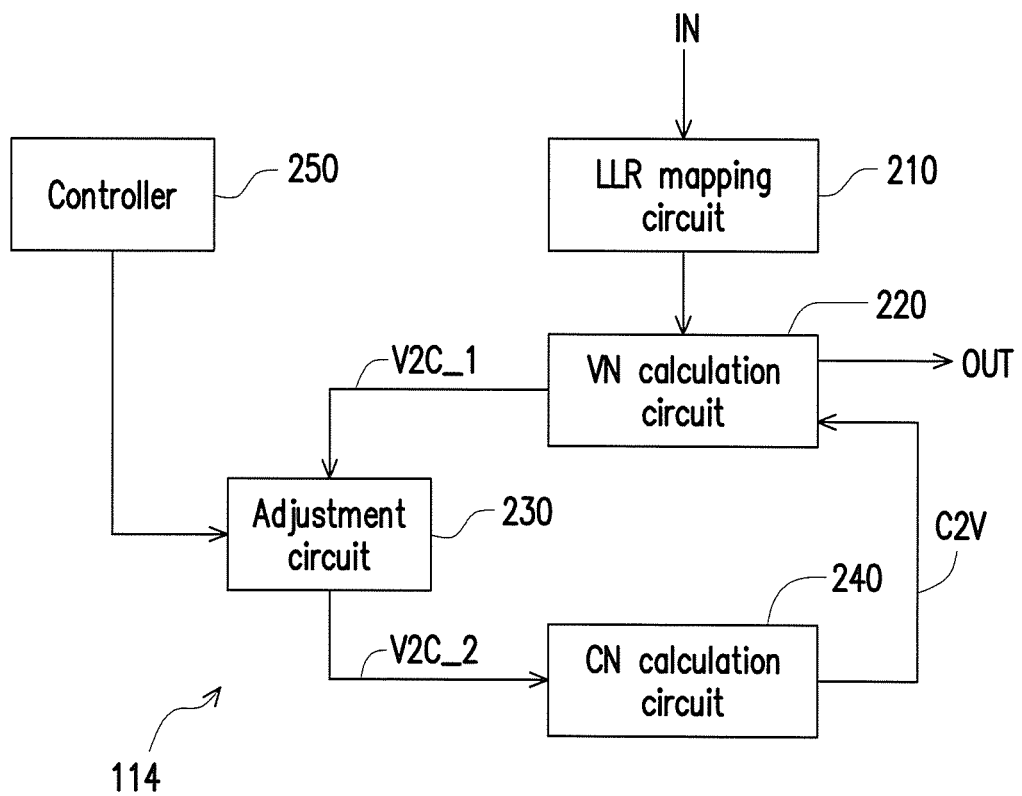
FIG. 2 is a circuit block schematic diagram of a low-density parity-check (LDPC) device of FIG. 1 according to an embodiment of the invention.

FIG. 2 is a circuit block schematic diagram of a LDPC device 114 of FIG. 1 according to an embodiment of the invention. The LDPC device 114 may perform an iteration operation of the LDPC decoding to decode the original codeword IN to obtain decoded data OUT. In the embodiment of FIG. 2, the LDPC device 114 includes a log likelihood ratio (LLR) mapping circuit 210, a VN calculation circuit 220, an adjustment circuit 230, a CN calculation circuit 240 and a controller 250.

Figure 3:
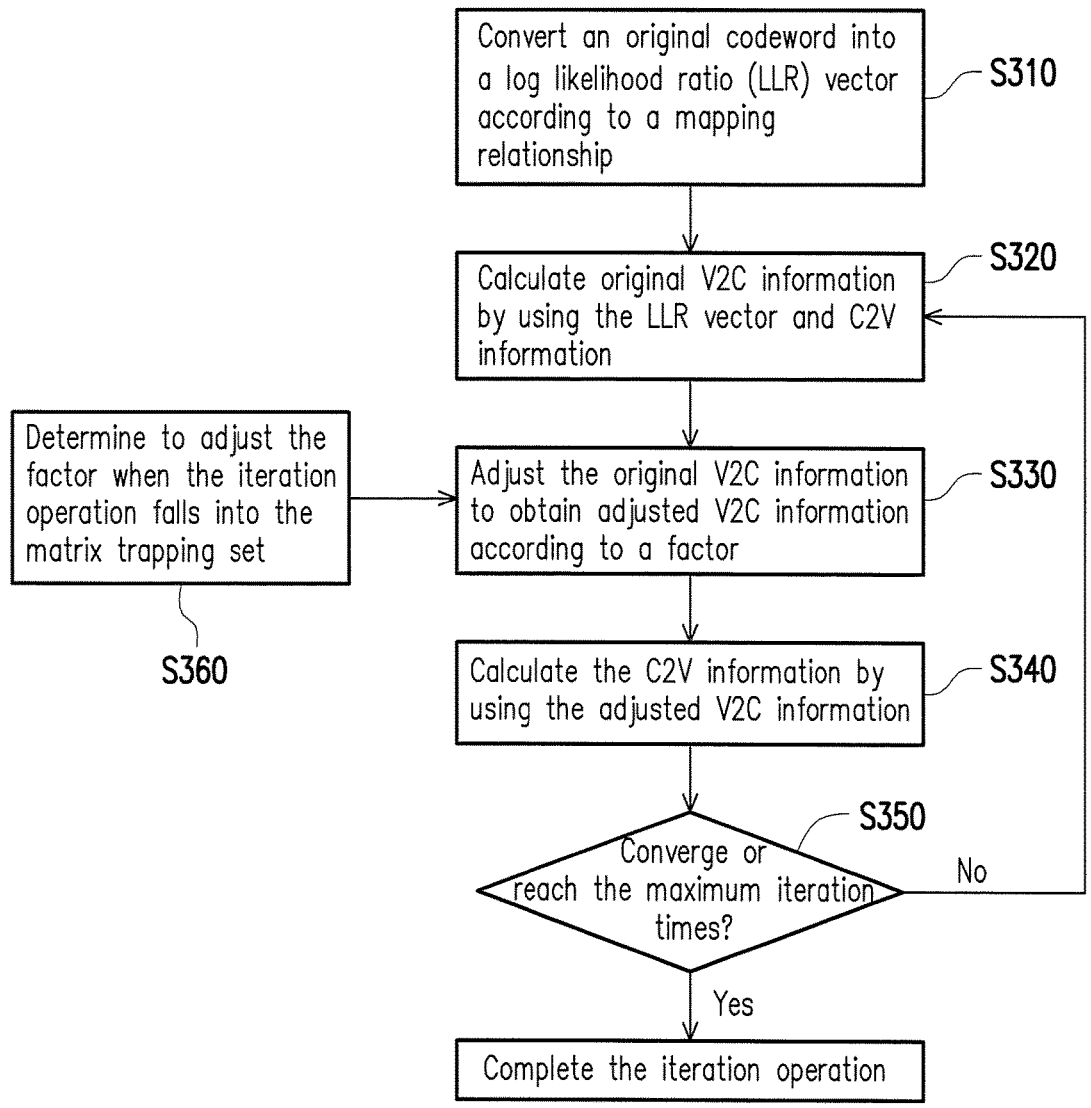
FIG. 3 is a flowchart illustrating a LDPC method and a matrix trapping set breaking method according to an embodiment of the invention.

FIG. 3 is a flowchart illustrating a LDPC method and a matrix trapping set breaking method according to an embodiment of the invention. Referring to FIG. 2 and FIG. 3, in step S310, the LLR mapping circuit 210 converts the original codeword IN into a LLR vector according to a mapping relationship. Any LLR value in the LLR vector represents probability that a certain specific bit of the original codeword IN is a certain value. A range of the LLR may be from −x to x. In some embodiments, −x represents that a certain specific bit of the original codeword IN is assured to be logic "1", and x represents that a certain specific bit of the original codeword IN is assured to be logic "0". In some other embodiments, −x represents that a certain specific bit of the original codeword IN is assured to be logic "0", and x represents that a certain specific bit of the original codeword IN is assured to be logic "1".

The VN calculation circuit 220 is coupled to the LLR mapping circuit 210 to receive the LLR vector. In step S320, the VN calculation circuit 220 calculates at least one original V2C information V2C_1 from the VNs to the CNs by using the LLR vector (provided by the LLR mapping circuit 210) and at least one C2V information (i.e. "C2V" shown in FIG. 2, which is provided by the CN calculation circuit 240). The calculation performed by the VN calculation circuit 220 is equivalent to a row processing of the check matrix H. An algorithm for calculating the V2C information by the VN calculation circuit 220 can be a conventional algorithm or other algorithm.

The adjustment circuit 230 is coupled to the VN calculation circuit 220 to receive the original V2C information V2C_1. In step S330, the adjustment circuit 230 adjusts the original V2C information V2C_1 to obtain at least one adjusted V2C information V2C_2 according to at least one factor. The factor is controlled by the controller 250. In some embodiments, the factor includes a scale factor SF, and the adjustment circuit 230 may calculate an equation V2C_2=V2C_1*SF to obtain the adjusted V2C information V2C_2, where the scale factor SF is a real number. For example (though the invention is not limited thereto), the scale factor SF is smaller than or equal to 1, and the scale factor SF is greater than 0. For example, the scale factor SF may be 1, 0.75, 0.625, 0.5 or other real number. In some other embodiments, the factor includes the scale factor SF and a constant C1, and the adjustment circuit 230 may calculate an equation V2C_2=V2C_1*SF+C1 to obtain the adjusted V2C information V2C_2, where the scale factor SF and the constant C1 are real numbers.

The CN calculation circuit 240 is coupled to the adjustment circuit 230 to receive the adjusted V2C information V2C_2. In step S340, the CN calculation circuit 240 calculates the a C2V information from the CN to the VN by using the adjusted V2C information V2C_2, and provides the C2V information (i.e. "C2V" shown in FIG. 2) to the VN calculation circuit 220. The calculation performed by the CN calculation circuit 240 is equivalent to a column processing of the check matrix H. An algorithm for calculating the C2V information by the CN calculation circuit 240 can be a conventional algorithm or other algorithm.

So far, the steps S320, S330 and S340 complete one iteration operation. The controller 250 may control the VN calculation circuit 220 and the CN calculation circuit 240 to perform/monitor the LDPC iteration operation. In step S350, the controller 250 determines whether the information of the VNs is converged. When the information of the VNs is not converged, it represents that the LDPC decoding is not successful, and the controller 250 may control the VN calculation circuit 220 and the CN calculation circuit 240 to perform a next iteration operation, i.e. to again execute the steps S320, S330, S340 and S350. When the information of the VNs is converged, it represents that the LDPC decoding is successful, and the controller 250 may stop/complete the iteration operation. In some cases, the number of times of the iteration operations has reached the maximum number of times, though the information of the VNs is still not converged, and now the controller 250 determines that the LDPC decoding is failed and stops the iteration operation.

Anyway, before the iteration operation is completed, the iteration operation of the LDPC decoding probably has a matrix trapping set phenomenon. The controller 250 requires to execute the matrix trapping set breaking method shown in FIG. 3, such that the iteration operation of the LDPC decoding is not kept trapping in an iteration loop of the matrix trapping set. The controller 250 may get to learn whether the matrix trapping set phenomenon is occurred. The "matrix trapping set" and "how to get to learn the matrix trapping set" belong to conventional techniques, which are not repeated.

The controller 250 is coupled to the adjustment circuit 230. In step S360, the controller 250 determines whether to adjust the factor of the step S330. When the iteration operation of the LDPC decoding falls into the matrix trapping set, in the step S360, the controller 250 decides to adjust the factor of the step S330, so that the iteration operation of the LDPC decoding breaks away from the matrix trapping set. For example, in case that the iteration operation of the LDPC decoding does not fall into the matrix trapping set, the factor of the step S330 can be 0.75, and when the iteration operation of the LDPC decoding falls into the matrix trapping set, the controller 250 may adjust the factor of the step S330 to 0.5.

Figure 4:
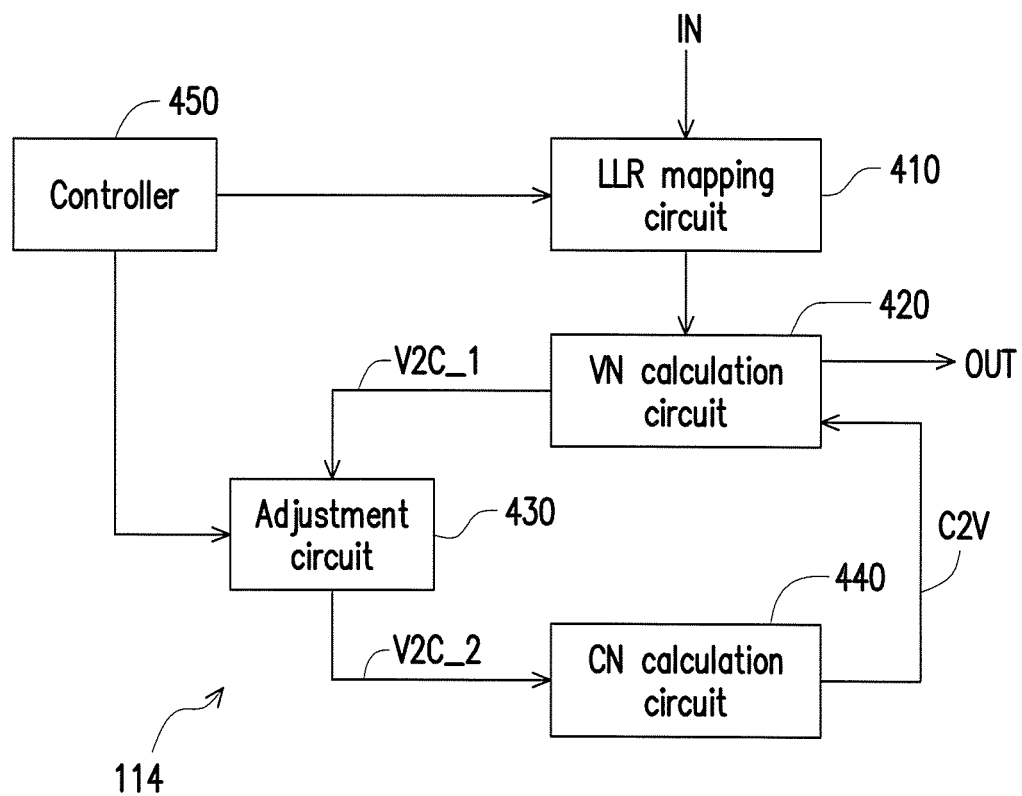
FIG. 4 is a circuit block schematic diagram of the LDPC device of FIG. 1 according to another embodiment of the invention.

FIG. 4 is a circuit block schematic diagram of the LDPC device 114 of FIG. 1 according to another embodiment of the invention. In the embodiment of FIG. 4, the LDPC device 114 includes a LLR mapping circuit 410, a VN calculation circuit 420, an adjustment circuit 430, a CN calculation circuit 440 and a controller 450. Description of the LLR mapping circuit 410, the VN calculation circuit 420, the adjustment circuit 430, the CN calculation circuit 440 and the controller 450 of FIG. 4 may refer to related description of the LLR mapping circuit 210, the VN calculation circuit 220, the adjustment circuit 230, the CN calculation circuit 240 and the controller 250 of FIG. 2, and details thereof are not repeated.

In the embodiment of FIG. 4, the controller 450 may control the LLR mapping circuit 410 to determine whether to adjust the mapping relationship of the LLR mapping circuit 410. When the iteration operation of the LDPC decoding falls into the matrix trapping set, the controller 450 determines to adjust the mapping relationship of the LLR mapping circuit 410, such that the iteration operation of the LDPC decoding breaks away from the matrix trapping set. When the iteration operation of the LDPC decoding falls into the matrix trapping set, the controller 450 may further determine to change the factor of the adjustment circuit 430 (referring to related description of the adjustment circuit 230 of FIG. 2), such that the iteration operation of the LDPC decoding breaks away from the matrix trapping set.

In some embodiments, the LLR mapping circuit 410 includes a plurality of look-up tables having different mapping relationships. When the iteration operation of the LDPC decoding does not fall into the matrix trapping set, the controller 450 controls the LLR mapping circuit 410 to select one of the look-up tables (for example, a default look-up table, which is referred to as a first look-up table) to convert the original codeword IN into the LLR vector for providing to the VN calculation circuit 420. When the iteration operation of the LDPC decoding falls into the matrix trapping set, the controller 450 controls the LLR mapping circuit 410 to select another one of the look-up tables (for example, a second look-up table) to convert the original codeword IN into the LLR vector for providing to the VN calculation circuit 420.

In some other embodiments, the LLR mapping circuit 410 may convert the original codeword IN into an original LLR vector LLR_1. The algorithm for converting the original codeword IN into the original LLR vector LLR_1 may refer to the conventional algorithm or other algorithm. The LLR mapping circuit 410 may calculate an equation LLR_2=LLR_1*C2+C3 to obtain the LLR vector LLR_2, where C2 represents a first constant, C3 represents a second constant, and C2 and C3 are real numbers. When the iteration operation of the LDPC decoding falls into the matrix trapping set, the controller 450 may adjust the first constant C2 or adjust the second constant C3, or adjust the first constant C2 and the second constant C3, such that the iteration operation of the LDPC decoding breaks away from the matrix trapping set. For example (though the invention is not limited thereto), when the iteration operation of the LDPC decoding does not fall into the matrix trapping set, the controller 450 may set the first constant C2 to 1and set the second constant C3 to 0; when the iteration operation of the LDPC decoding falls into the matrix trapping set, the controller 450 may set the first constant C2 to a real number not equal to 1and 0, and/or set the second constant C3 to a real number not equal to 0.

It should be noted that in different application situations, related functions of the CPU 111, the memory control circuit 112, the memory buffer 113, the LDPC device 114, the LLR mapping circuit 210, the VN calculation circuit 220, the adjustment circuit 230, the CN calculation circuit 240, the controller 250, the LLR mapping circuit 410, the VN calculation circuit 420, the adjustment circuit 430, the CN calculation circuit 440 and/or the controller 450 included in the memory controller 110 can be implemented as software, firmware or hardware by using general programming languages (for example, C or C++), hardware description languages (for example, Verilog HDL or VHDL) or other suitable programming languages. The software (or firmware) capable of implementing the related functions can be stored in any computer-assessable medias, for example, magnetic tapes, semiconductor memories, magnetic disks or compact disks, for example, CD-ROM or DVD-ROM, or the software (or firmware) can be transmitted through the Internet, wired communication, wireless communication or other communication media. The software (or firmware) can be stored in the computer-assessable medias to facilitate a processor of the computer to access/execute programming codes of the software (or firmware). Moreover, the apparatus and method of the invention can be implemented through a combination of hardware and software.

In summary, the LDPC apparatus and the matrix trapping set breaking method of the invention may determine whether to adjust the V2C information transmitted to the CN from the VN. When the iteration operation of the LDPC decoding falls into the matrix trapping set, it is determined to adjust the factor (a scale factor of the V2C information) to change the adjusted V2C information, so that the iteration operation breaks away from the matrix trapping set.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A low-density parity-check (LDPC) apparatus, configured to perform an iteration operation to decode an original codeword, comprising:
    a log likelihood ratio (LLR) mapping circuit, configured to convert the original codeword into a LLR vector according to a mapping relationship;
    a variable node (VN) calculation circuit, coupled to the LLR mapping circuit for receiving the LLR vector, and configured to calculate at least one original variable-node to check-node (V2C) information from at least one VN to at least one check node (CN) by using the LLR vector and at least one check-node to variable-node (C2V) information;
    an adjustment circuit, coupled to the VN calculation circuit to receive the original V2C information, and configured to adjust the original V2C information to obtain at least one adjusted V2C information according to at least one factor, wherein the factor is multiplied to the original V2C information;
    a check node calculation circuit, coupled to the adjustment circuit to receive the adjusted V2C information, and configured to calculate the at least one C2V information from the CN to the VN by using the adjusted V2C information, and providing the at least one C2V information to the VN calculation circuit; and
    a controller, coupled to the adjustment circuit, and configured to determine whether to adjust the factor, wherein when the iteration operation falls into a matrix trapping set, the controller decides to adjust the factor to break the iteration operation away from the matrix trapping set.

2. The LDPC apparatus as claimed in claim 1, wherein the controller is further configured to control the VN calculation circuit and the CN calculation circuit to perform the iteration operation.

3. The LDPC apparatus as claimed in claim 1, wherein the factor comprises a scale factor SF, and the adjustment circuit calculates an equation $V2C\_2 = V2C\_1 * SF$ to obtain the adjusted V2C information $V2C\_2$, wherein $V2C\_1$ represents the original V2C information, and the scale factor SF is a real number.

4. The LDPC apparatus as claimed in claim 3, wherein the scale factor SF is smaller than 1 and greater than 0.

5. The LDPC apparatus as claimed in claim 1, wherein the factor comprises a scale factor SF and a constant C1, and the adjustment circuit calculates an equation $V2C\_2 = V2C\_1 * SF + C1$ to obtain the adjusted V2C information $V2C\_2$, wherein $V2C\_1$ represents the original V2C information, and the scale factor SF and the constant C1 are real numbers.

6. The LDPC apparatus as claimed in claim 1, wherein the controller is further configured to determine whether to adjust the mapping relationship, and the controller determines to adjust the mapping relationship to break the iteration operation away from the matrix trapping set when the iteration operation falls into the matrix trapping set.

7. The LDPC apparatus as claimed in claim 6, wherein the LLR mapping circuit comprises a plurality of look-up tables having different mapping relationships, the controller controls the LLR mapping circuit to select a first look-up table in the look-up tables to convert the original codeword into the LLR vector when the iteration operation does not fall into the matrix trapping set, and the controller controls the LLR mapping circuit to select a second look-up table in the look-up tables to convert the original codeword into the LLR vector when the iteration operation falls into the matrix trapping set.

8. The LDPC apparatus as claimed in claim 6, wherein the LLR mapping circuit converts the original codeword into an original LLR vector $LLR\_1$;
    the LLR mapping circuit calculates an equation $LLR\_2 = LLR\_1 * C2 + C3$ to obtain the LLR vector $LLR\_2$, wherein C2 represents a first constant, C3 represents a second constant, and C2 and C3 are real numbers; and
    when the iteration operation falls into the matrix trapping set, the controller adjusts the first constant C2 or adjusts the second constant C3, or adjusts the first constant C2 and the second constant C3, to break the iteration operation away from the matrix trapping set.

9. The LDPC apparatus as claimed in claim 8, wherein when the iteration operation does not fall into the matrix trapping set, the controller sets the first constant C2 to 1, and sets the second constant C3 to 0.

10. A matrix trapping set breaking method, configured to make an iteration operation executed by a low-density parity-check apparatus to break away from a matrix trapping set, the matrix trapping set breaking method comprising:
    converting an original codeword into a log likelihood ratio (LLR) vector according to a mapping relationship;
    calculating at least one original variable-node to check-node (V2C) information from at least one variable node (VN) to at least one check node (CN) by using the LLR vector and at least one check-node to variable-node (C2V) information;
    adjusting the original V2C information to obtain at least one adjusted V2C information according to at least one factor, wherein the factor is multiplied to the original V2C information;
    calculating the at least one C2V information from the CN to the VN by using the adjusted V2C information; and
    determining whether to adjust the factor, wherein when the iteration operation falls into a matrix trapping set, it is determined to adjust the factor to break the iteration operation away from the matrix trapping set.

11. The matrix trapping set breaking method as claimed in claim 10, wherein the factor comprises a scale factor SF, and the step of adjusting the original V2C information comprises:

calculating an equation V2C_2=V2C_1*SF to obtain the adjusted V2C information V2C_2, wherein V2C_1 represents the original V2C information, and the scale factor SF is a real number.

12. The matrix trapping set breaking method as claimed in claim 11, wherein the scale factor SF is smaller than 1 and greater than 0.

13. The matrix trapping set breaking method as claimed in claim 10, wherein the factor comprises a scale factor SF and a constant C1, and the step of adjusting the original V2C information comprises:

calculating an equation V2C_2=V2C_1*SF+C1 to obtain the adjusted V2C information V2C_2, wherein V2C_1 represents the original V2C information, and the scale factor SF and the constant C1 are real numbers.

14. The matrix trapping set breaking method as claimed in claim 10, further comprising:

determining whether to adjust the mapping relationship, wherein when the iteration operation falls into the matrix trapping set, it is determined to adjust the mapping relationship to break the iteration operation away from the matrix trapping set.

15. The matrix trapping set breaking method as claimed in claim 14, wherein the step of adjusting the mapping relationship comprises:

providing a plurality of look-up tables having different mapping relationships;

selecting a first look-up table in the look-up tables to convert the original codeword into the LLR vector when the iteration operation does not fall into the matrix trapping set; and selecting a second look-up table in the look-up tables to convert the original codeword into the LLR vector when the iteration operation falls into the matrix trapping set.

16. The matrix trapping set breaking method as claimed in claim 14, wherein the step of adjusting the mapping relationship comprises:

converting the original codeword into an original LLR vector LLR_1;

calculating an equation LLR_2=LLR_1*C2+C3 to obtain the LLR vector LLR_2, wherein C2 represents a first constant, C3 represents a second constant, and C2 and C3 are real numbers; and adjusting the first constant C2, or adjusting the second constant C3, or adjusting the first constant C2 and the second constant C3 when the iteration operation falls into the matrix trapping set, to break the iteration operation away from the matrix trapping set.

17. The matrix trapping set breaking method as claimed in claim 16, wherein the step of adjusting the mapping relationship comprises:

setting the first constant C2 to 1, and setting the second constant C3 to 0 when the iteration operation does not fall into the matrix trapping set.

* * * * *